(12) United States Patent
Matsukawa et al.

(10) Patent No.: US 6,917,492 B2
(45) Date of Patent: Jul. 12, 2005

(54) MAGNETORESISTIVE ELEMENT AND METHOD FOR MANUFACTURING THE SAME AND NONVOLATILE MEMORY INCLUDING THE SAME

(75) Inventors: Nozomu Matsukawa, Nara (JP); Masayoshi Hiramoto, Ikoma (JP); Akihiro Odagawa, Tsuchiura (JP); Yasunari Sugita, Osaka (JP); Mitsuo Satomi, Katano (JP); Yoshio Kawashima, Neyagawa (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 12 days.

(21) Appl. No.: 10/611,224

(22) Filed: Jun. 27, 2003

(65) Prior Publication Data

US 2004/0027733 A1 Feb. 12, 2004

Related U.S. Application Data

(63) Continuation of application No. PCT/JP03/01596, filed on Feb. 14, 2003.

(30) Foreign Application Priority Data

Feb. 15, 2002 (JP) ........................................ 2002-038125

(51) Int. Cl.[7] .............................................. G11B 5/127
(52) U.S. Cl. ..................... 360/110; 360/324.1
(58) Field of Search ............................. 360/110, 324.1, 360/324.2, 121, 126, 125; 428/692; 29/603.14, 603.13

(56) References Cited

U.S. PATENT DOCUMENTS

| | | | |
|---|---|---|---|
| 5,780,176 A | | 7/1998 | Iwasaki et al. |
| 6,028,786 A | | 2/2000 | Nishimura |
| 6,144,524 A | * | 11/2000 | Haratani et al. ....... 360/324.12 |
| 2003/0184921 A1 | * | 10/2003 | Sugita et al. ............ 360/324.1 |

FOREIGN PATENT DOCUMENTS

| | | |
|---|---|---|
| EP | 1 143 537 | 10/2001 |
| EP | 1 182 713 | 2/2002 |
| JP | 9-138919 | 5/1997 |
| JP | 2000-076844 | 3/2000 |
| JP | 2002-319722 | 10/2002 |
| JP | 2002-344042 | 11/2002 |
| JP | 2003-86865 | 3/2003 |

OTHER PUBLICATIONS

"Tunnel Magnetoresistance Enhancement for Pt–Added Magnetic Tunnel Junctions", Y. Sugita et al. Japanese Journal of Applied Physics, vol. 41, No. 10A, pp. L1072–L1074, Part 2, No. 10A, Oct. 1, 2002.
"Journal of Applied Physics", Zongzhi Zhang et al., vol. 89, No. 11, pp 6665–6667, Jun. 1, 2001.
"Journal of the Magnetics Society of Japan", N. Kobayashi et al., vol. 25, No. 4–2, 2001.

* cited by examiner

Primary Examiner—Allen Cao
(74) Attorney, Agent, or Firm—Merchant & Gould P.C.

(57) ABSTRACT

A magnetoresistive element includes a pair of ferromagnetic layers and a non-magnetic layer arranged between the ferromagnetic layers. At least one of the ferromagnetic layers has a composition expressed by $(M_xL_y)_{100-z}R_z$ at the interface with the non-magnetic layer. The non-magnetic layer includes at least one element selected from the group consisting of B, C, N, O, and P. Here, M is $Fe_aCo_bNi_c$, L is at least one element selected from the group consisting of Pt, Pd, Ir, and Rh, R is an element that has a lower free energy to form a compound with the element of the non-magnetic layer that is at least one selected from the group consisting of B, C, N, O, and P than does any other element included in the composition as M or L, and a, b, c, x, y, and z satisfy $a+b+c=100$, $a \geq 30$, $x+y=100$, $0<y \leq 35$, and $0.1 \leq z \leq 20$. This element can provide a high MR ratio. A method for manufacturing a magnetoresistive element includes a first heat treatment process at 200° C. to 330° C. for not less than one hour and a second heat treatment process at not less than 340° C. performed after the first heat treatment process.

10 Claims, 5 Drawing Sheets

MAGNETORESISTIVE ELEMENT AND METHOD FOR MANUFACTURING THE SAME AND NONVOLATILE MEMORY INCLUDING THE SAME

BACKGROUND OF THE INVENTION

1. Field of the Invention

The present invention relates to a magnetoresistive element used in a magnetic head, a magnetic random access memory (MRAM), etc. and a nonvolatile memory including the magnetoresistive element.

2. Description of the Related Art

A multilayer film with a basic structure of ferromagnetic layer/non-magnetic layer/ferromagnetic layer can provide magnetoresistance effects by allowing a current to flow across the non-magnetic layer. When the non-magnetic layer is a tunnel insulating layer, a spin tunnel effect can be obtained. When the non-magnetic layer is a conductive metal such as Cu, a CPP (current perpendicular to the plane) GMR effect can be obtained. These magnetoresistance effects depend on the magnitude of a relative angle between magnetizations of the ferromagnetic layers that sandwich the non-magnetic layer.

For a magnetic memory device using the magnetoresistance effects, information is written by changing the magnetization direction of a ferromagnetic layer that serves as a storage layer, and the information is read by detecting the resultant change in resistance. Generally, a "hard" magnetic material having a large coercive force or a magnetic material that is "pinned" by laminating an antiferromagnetic layer is used for the ferromagnetic layer to correlate the storage layer with the relative angle between magnetizations. Thus, the magnetization direction of this ferromagnetic layer cannot be affected easily by an external magnetic field. A "soft" magnetic material whose magnetization direction is changed under a weak magnetic field is used for the storage layer. A magnetic field generated by a current flowing through a conductor that is located quite close to the storage layer changes only the magnetization direction of the storage layer to write information.

When a magnetoresistive element is used in a device, particularly in MRAM or the like, a monolithic structure combining the magnetoresistive element and a conventional Si semiconductor is essential in view of the cost and the degree of integration. The manufacturing process of the Si semiconductor includes heat treatment at high temperatures, e.g., heat treatment in hydrogen at 400° C. to 450° C. to remove wiring defects. However, the magnetoresistance characteristics of the magnetoresistive element are degraded by heat treatment at about 300° C. to 350° C. Even if the magnetoresistive element has high heat resistance, the degradation occurs at 300° C. to 380° C. or more.

A method in which a magnetoresistive element is incorporated after the formation of a semiconductor element also has been proposed. However, this method requires that wiring or the like for applying a magnetic field to the magnetoresistive element should be formed after producing the element. Accordingly, a variation in wiring resistance cannot be suppressed without the heat treatment for defect removal, thus reducing the reliability and stability of the element.

The wiring resistance variation can be suppressed easily by increasing a signal output from the magnetoresistive element. Therefore, it is desirable to make the rate of change in magnetoresistance (MR ratio) of the magnetoresistive element as high as possible.

SUMMARY OF THE INVENTION

It is an object of the present invention to provide a magnetoresistive element that can achieve a high MR ratio. It is another object of the present invention to provide a magnetoresistive element that can exhibit excellent magnetoresistance characteristics after heat treatment at not less than 340° C., and particularly at not less than 380° C.

A magnetoresistive element of the present invention includes a first ferromagnetic layer, a second ferromagnetic layer, and a non-magnetic layer arranged between the first ferromagnetic layer and the second ferromagnetic layer. A resistance value changes with a change in relative angle formed by the magnetization directions of the first ferromagnetic layer and the second ferromagnetic layer. At least one of the first ferromagnetic layer and the second ferromagnetic layer has a composition expressed by $(M_xL_y)_{100-z}R_z$ at the interface with the non-magnetic layer. The non-magnetic layer includes at least one element selected from the group consisting of B, C, N, O, and P.

In this magnetoresistive element, M is $Fe_aCo_bNi_c$. L is at least one element selected from the group consisting of Pt, Pd, Ir, and Rh. R is an element that has a lower free energy to form a compound with the element of the non-magnetic layer that is at least one selected from the group consisting of B, C, N, O, and P than does any other element included in the composition as M or L. Moreover, a, b, and c satisfy $a+b+c=100$ and $a \geq 30$, and x, y, and z satisfy $x+y=100$, $0<y \leq 35$, and $0.1 \leq z \leq 20$.

Another aspect of the present invention is a method for manufacturing a magnetoresistive element. The magnetoresistive element includes a first ferromagnetic layer, a second ferromagnetic layer, and a non-magnetic layer arranged between the first ferromagnetic layer and the second ferromagnetic layer. A resistance value changes with a change in relative angle formed by the magnetization directions of the first ferromagnetic layer and the second ferromagnetic layer. This method includes at least a film formation process for forming the non-magnetic layer and at least one of the first ferromagnetic layer and the second ferromagnetic layer, and at least two heat treatment processes performed after the film formation process. The at least two heat treatment processes include a first heat treatment process at 200° C. to 330° C. for not less than one hour and a second heat treatment process at not less than 340° C. The first heat treatment process is performed before the second heat treatment process.

BRIEF DESCRIPTION OF THE DRAWINGS

FIGS. 2A to 2C are cross-sectional views schematically showing a change in the vicinity of a non-magnetic layer caused by a heat treatment process of the present invention.

DESCRIPTION OF THE PREFERRED EMBODIMENTS

In an embodiment of a magnetoresistive element of the present invention, at least one of a pair of ferromagnetic layers adjacent to a non-magnetic layer has a composition expressed by $(M_xL_y)_{100-z}R_z$ at the interface with the non-magnetic layer. Here, L, R, x, y, and z are as described above, and M is $Fe_aCo_bNi_c$ (a, b, and c are as described above). M can be either a three-component system (b>0, c>0) or a two-component system of Fe and Co or Ni. In this case, M is preferably $Fe_aCo_b$ (a+b=100, a≧40) or $Fe_aNi_c$ (a+c=100, a≧30).

The element L can be at least one element selected from the group consisting of Pt, Pd, Ir, and Rh or an alloy of at least two elements. It is preferable that the element L includes Pt.

The element R is determined so that a free energy for forming a compound of the element R and the element of the non-magnetic layer that is at least one selected from the group consisting of B, C, N, O, and P is lower than a free energy for forming a compound of the element included in the composition as M or L and the element of the non-magnetic layer (e.g., O). It is preferable that the element R is at least one element selected from the group consisting of Mn, Cr, V, Ti, Zr, Nb, Mo, Hf, Ta, and W, and particularly includes Mn.

It is preferable that the non-magnetic layer is at least one selected from the group consisting of an oxide, a nitride, and a carbide, and particularly includes an oxide as the main component. In this specification, the main component is referred to as a component that accounts for 50 wt % or more. An Al oxide is suitable for the oxide.

The magnetoresistive element of the present invention further may include another layer. For example, the layer may include the element R in an amount of not less than 1.5 z at %, which is at least 1.5 times as much as the content in the non-magnetic layer. This layer can be located 3 nm to 30 nm away from the interface between the ferromagnetic layer and the non-magnetic layer in the direction of the ferromagnetic layer having the above composition at that interface.

Figure 1:
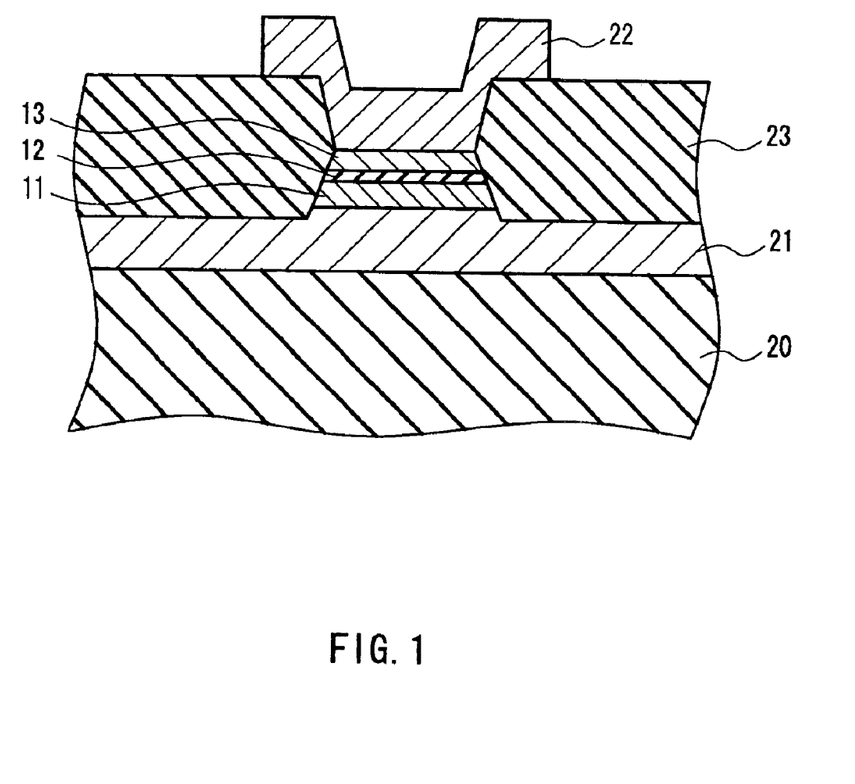
FIG. 1 is a cross-sectional view showing an embodiment of a magnetoresistive element of the present invention.

Hereinafter, embodiments of the present invention will be described in detail with reference to the drawings. FIG. 1 is a cross-sectional view showing an embodiment of a magnetoresistive element of the present invention.

As a substrate 20, a substrate with an insulated surface, e.g., a silicon (Si) substrate obtained by thermal oxidation, a quartz substrate, or a sapphire substrate can be used. A smoothing process such as CMP (chemical mechanical polishing) may be performed on the surface of the substrate. A switching element such as a MOS transistor may be produced on the surface of the substrate beforehand. In this case, it is preferable that an insulating layer is formed on the switching element, and then contact holes are provided in the necessary portions.

A multilayer film including at least a first ferromagnetic layer 11, a non-magnetic layer 12, and a second ferromagnetic layer 13 is formed on the substrate 20. It is preferable that the multilayer film further includes a pair of electrodes 21, 22 for sandwiching these layers 11, 12, 13 in the thickness direction. An interlayer insulating film 23 is arranged between the lower electrode 21 and the upper electrode 22. The composition of the entire ferromagnetic layers 11, 13 need not to be the same as the composition at the interface with the non-magnetic layer 12. A conductive or insulating material can be used for the non-magnetic layer 12 in accordance with the type of element. In a GMR element using the CPP-GMR effect, e.g., Cu, Au, Ag, Ru, Cr, and an alloy of these elements can be used for the material. In a TMR element using the spin tunnel effect, various insulators or semiconductors can be used for the material. An Al oxide, a nitride, or an oxynitride, particularly the Al oxide, is suitable for the non-magnetic layer of the TMR element.

A general thin film producing method can be used for forming each layer of the multilayer film, e.g., various types of sputtering such as ion beam sputtering, MBE (molecular beam epitaxy), CVD (chemical vapor deposition), or pulse laser deposition. For micro-fabrication, well known micro-fabrication techniques, e.g., photolithography using a contact mask or stepper, EB lithography, or FIB (focused ion beam) processing can be used. For etching, well known etching techniques, e.g., ion milling, RIE (reactive ion etching), or ion milling with ICP (inductively coupled plasma) can be used. CMP, precision lapping, etc. can be used for smoothing and the removal of unnecessary portions.

An embodiment of the present invention allows at least one of the ferromagnetic layers 11, 13, preferably both of them, to have a composition expressed by $(M_xL_y)_{100-z}R_z$ at least at the interface with the non-magnetic layer 12, thereby achieving a higher MR ratio compared with a conventional element. The higher the MR ratio is, the more easily the wiring resistance variation can be suppressed. As will be described later, the presence of elements L and R makes it possible to maintain and improve the magnetoresistance characteristics remarkably in two heat treatment processes of the present invention. Even if the two heat treatment processes are not performed, the interface of the ferromagnetic layer having the above composition contributes to an improvement in characteristics of the magnetoresistive element. For example, when a first heat treatment process is skipped and only a second heat treatment process is performed, the ferromagnetic layer can achieve a higher MR ratio compared with a conventional element because the elements L and R in the above range are included at the interface.

Another embodiment of the present invention includes a heat treatment process (first heat treatment process) at 200° C. to 330° C., preferably at 260° C. to 300° C., for not less than one hour, thereby increasing the MR ratio that is measured after the subsequent heat treatment process (second heat treatment process) at not less than 340° C., e.g., at 340° C. to 450° C. These heat treatment processes are performed after forming at least one of the ferromagnetic layers 11, 13, preferably both of them, and the non-magnetic layer 12.

When a conventional element is heat-treated at not less than 300° C., the magnetoresistance characteristics are often degraded. Even if the element has excellent heat resistance, the magnetoresistance characteristics are degraded by heat treatment at not less than 350° C., although they can be maintained approximately up to 340° C. However, by performing the first heat treatment process beforehand, favorable magnetoresistance characteristics can be achieved even after heat treatment at not less than 340° C. (the second heat treatment process). The effect of the first heat treatment process becomes prominent when the second heat treatment process is performed at not less than 380° C., particularly at 400° C. to 450° C. or more.

The first heat treatment process may be performed in either the presence or absence of a magnetic field. The heat treatment at about 400° C. in a Si semiconductor process may be performed as the second heat treatment process or part of the second heat treatment process. The Si semiconductor process includes, e.g., heat treatment at 400° C. to 450° C. so as to reduce wiring defects and the contact resistance between wirings or between a wiring and an element.

The magnetoresistance characteristics after the second heat treatment process are improved by performing the first heat treatment process. This is attributed to an improvement in barrier characteristics of the non-magnetic layer. The magnetoresistance characteristics can be better with decreasing defects in a barrier or increasing the height of the barrier. The reason for an improvement in magnetoresistance characteristics will be described by referring to FIGS. 2A to 2C.

Immediately after film formation (FIG. 2A), the magnetic metal (e.g., Fe) of the ferromagnetic layers and the reactive species (e.g., Al, O, and N) of the non-magnetic layer are distributed in the vicinity of the interfaces between the nonmagnetic layer 12 and each of the ferromagnetic layers 11, 13. Particularly when the non-magnetic film is formed in such a manner that a metal thin film having a thickness of several Å to several nm is formed, and then reactive species (e.g., O) are supplied to the metal thin film, the non-magnetic film deviates from the stoichiometry of a compound to be formed particularly in the vicinity of the interfaces immediately after the film formation.

Figure 2A:
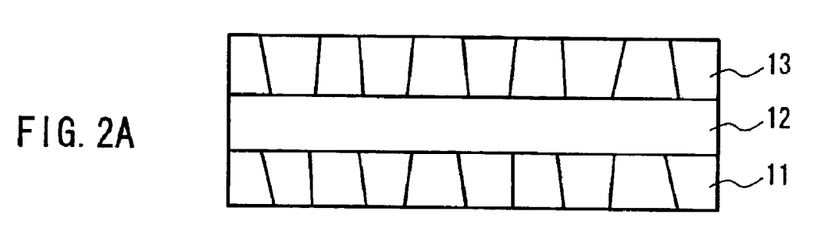
FIG. 2A shows the state immediately after film formation.
Figure 2B:
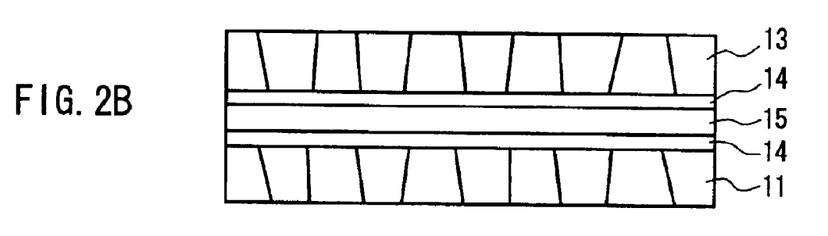
FIG. 2B shows the state after a first heat treatment process.
Figure 2C:
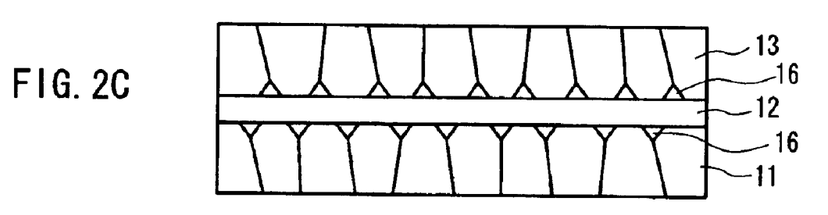
FIG. 2C shows the state after a second heat treatment process.

By maintaining the vicinity of the interfaces at 200° C. to 330° C. (the first heat treatment process; FIG. 2B), the magnetic metal is gathered at the interfaces to form impurity layers 14. This is because the mutual diffusion between the magnetic metal (e.g., Fe) and a non-magnetic compound (e.g., AlOx) does not occur readily, and the magnetic metal can form a mixed crystal with a metallic compound (e.g., FeOx—AlOx) that includes a transition metal. At this stage, a chemical bond relatively is strengthened in a barrier center 15. During the second heat treatment process, the presence of the element R (e.g., Mn) may accelerate the consumption of the impurity layers 14, specifically the reduction of the magnetic metal such as Fe. Consequently, the purity of the non-magnetic layer 12 is increased particularly in the central portion, and thus defects also are reduced throughout the barrier (FIG. 2C).

After the second heat treatment process, the element R is considered to be present as a compound in, e.g., grain boundaries 16 that are in contact with the interfaces. The experiments show that the effect of the element R becomes more prominent by the element L. Although the reason for this is not clarified fully at present, catalysis of the element L may accelerate the reduction of the element M by the element R. There is also a possibility that the addition of the element L (noble metal) generates an M-L alloy with low reactivity and makes it difficult for the element M to react with the components of the non-magnetic compound immediately after the film formation.

The element R may be present at the interfaces of the non-magnetic layer before performing the first heat treatment process. However, the above effects can be obtained even if the element R diffuses and reaches the interfaces by heat treatment. The diffusion of the element R becomes active in the temperature range of the second heat treatment process. The element R, which reaches near the interfaces after the impurity layers 14 are formed to some extent during the first heat treatment process, reduces an imperfect compound of the impurity layers 14, and then is separated as an impurity to the grain boundaries.

A layer that includes the element R in an amount of not less than 1.5 z % and is located 3 nm to 30 nm away from the interface is suitable for the source of diffusion for the element R into the interface. For an element particularly including this layer, the composition of the interface of the ferromagnetic layer may be $(M_xL_y)_{100-z'}R_{z'}$ ($0 \leq z' < 0.1$) at the time of film formation and changed to $(M_xL_y)_{100-z}R_z$ by the diffusion of the element R during the second heat treatment process.

A magnetoresistive element of the present invention has the basic configuration in which the non-magnetic layer 12 is arranged between the ferromagnetic layers 11, 13. However, the magnetoresistive element may include additional layers as shown in FIGS. 3A to 3H. If necessary, lower and upper electrodes are arranged respectively below and above the laminate shown, although these drawings omit both electrodes. Other layers that are not illustrated in the drawings (e.g., an underlying layer and a protective layer) also can be added.

Figure 3A:
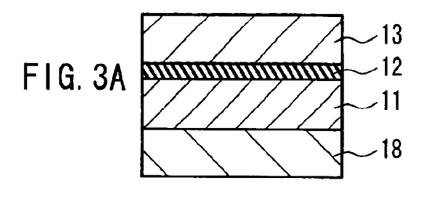
FIGS. 3A to 3H are cross-sectional views, each showing an example of the film configuration of a magnetoresistive element of the present invention.
Figure 3B:
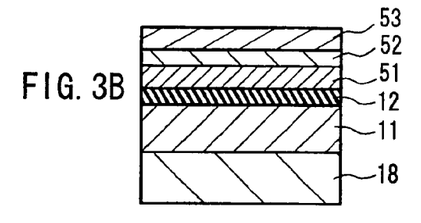

As shown in FIG. 3A, an antiferromagnetic layer 18 is formed in contact with a ferromagnetic layer 11. In this element, the ferromagnetic layer 11 shows unidirectional anisotropy due to an exchange bias magnetic field with the antiferromagnetic layer 18, and thus the reversing magnetic field becomes larger. The addition of the antiferromagnetic layer 18 allows the element to be a spin valve element, in which the ferromagnetic layer 11 functions as a pinned (magnetic) layer and the other ferromagnetic layer 13 functions as a free (magnetic) layer. As shown in FIG. 3B, a laminated ferrimagnetic material may be used as the free layer. The laminated ferrimagnetic material includes a pair of ferromagnetic films 51, 53 and a non-magnetic metal film 52 sandwiched between the ferromagnetic films.

Figure 3C:
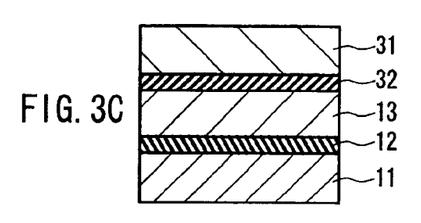
Figure 3D:
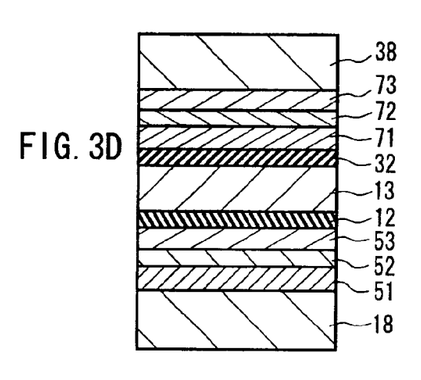

As shown in FIG. 3C, the element may be formed as a dual spin valve element. In this element, two pinned layers 11, 31 are arranged so as to sandwich a free layer 13, and non-magnetic layers 12, 32 are located between the free layer 13 and each of the pinned layers 11, 31. As shown in FIG. 3D, laminated ferrimagnetic materials 51, 52, 53; 71, 72, 73 may be used as the pinned layers 11, 31 in the dual spin valve element. In this element, antiferromagnetic layers 18, 38 are arranged in contact with the pinned layers 11, 31.

Figure 3E:
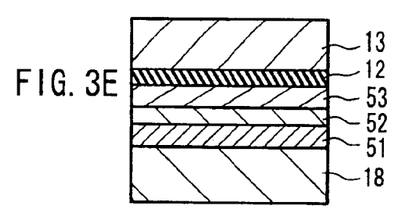

As shown in FIG. 3E, a laminated ferrimagnetic material may be used as the pinned layer of the element in FIG. 3A. The laminated ferrimagnetic material includes a pair of ferromagnetic films 51, 53 and a non-magnetic metal film 52 sandwiched between the ferromagnetic films.

Figure 3F:
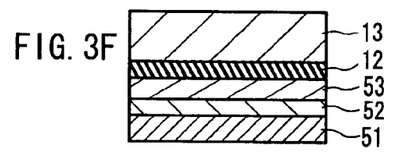

As shown in FIG. 3F, the element may be formed as a differential coercive force element that does not include an antiferromagnetic layer. In this element, a laminated ferrimagnetic material 51, 52, 53 is used as the pinned layer.

Figure 3G:
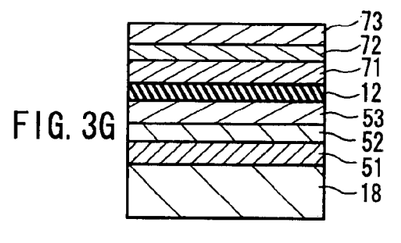

As shown in FIG. 3G, a laminated ferrimagnetic material 71, 72, 73 may be used as the free layer 13 of the element in FIG. 3E.

Figure 3H:
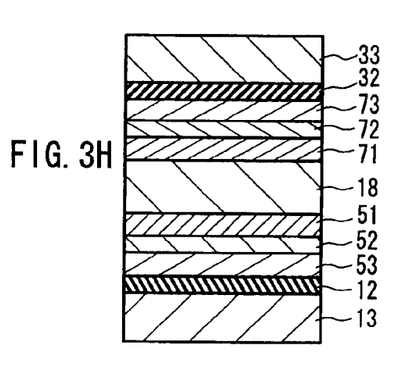

As shown in FIG. 3H, a pinned layer, a non-magnetic layer 12(32), and a free layer 13(33) may be arranged on both sides of an antiferromagnetic layer 18. In this element, laminated ferrimagnetic materials 51, 52, 53; 71, 72, 73 are used as the pinned layer.

Various conventionally known materials also can be used for other layers of the multilayer films shown in FIGS. 3A to 3H without any limitation.

A Mn-containing antiferromagnetic material or Cr-containing antiferromagnetic material may be used as the antiferromagnetic layer. Examples of the Mn-containing antiferromagnetic material include PtMn, PdPtMn, FeMn, IrMn, and NiMn. Examples of a material for the non-magnetic film that constitutes the laminated ferrimagnetic material include Cr, Cu, Ag, Au, Ru, Ir, Re, Os, Rh, and an alloy and an oxide of these elements.

Figure 4A:
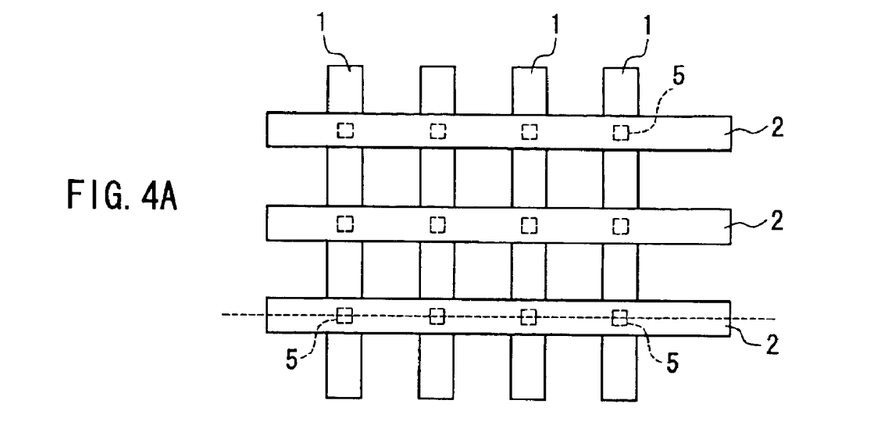
FIGS. 4A and 4B are a plan view and a cross-sectional view, respectively, showing an embodiment of a nonvolatile memory of the present invention.
Figure 4B:
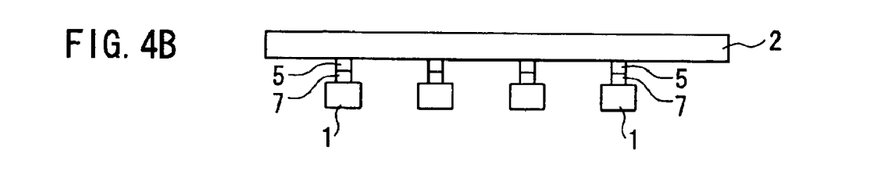

FIGS. 4A and 4B show an example of a memory that uses a magnetoresistive element of the present invention as a memory device. In this memory, magnetoresistive elements 5 are arranged at the intersections of first conductive wires 1 and second conductive wires 2 to form a matrix. The first conductive wires 1 extend in a predetermined direction, and the second conductive wires 2 extend perpendicular to the first conductive wires 1. A switching element (diode) 7 is arranged between each of the magnetoresistive elements 5 and the first conductive wires 1.

Figure 5A:
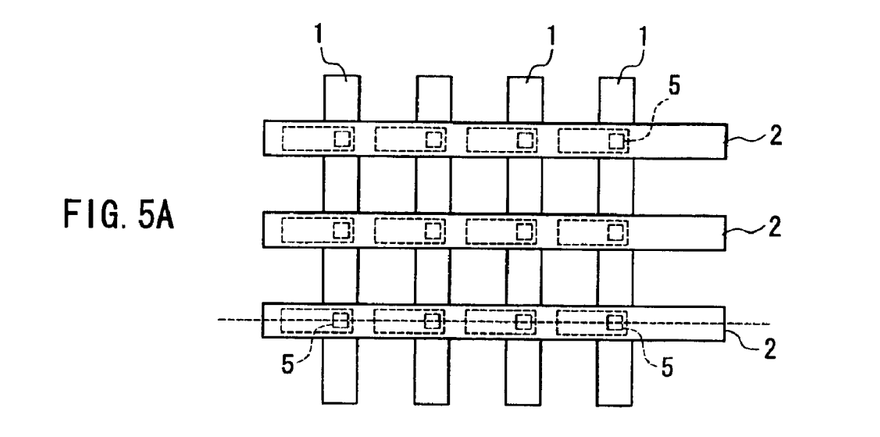
FIGS. 5A and 5B are a plan view and a cross-sectional view, respectively, showing another embodiment of a nonvolatile memory of the present invention.
Figure 5B:
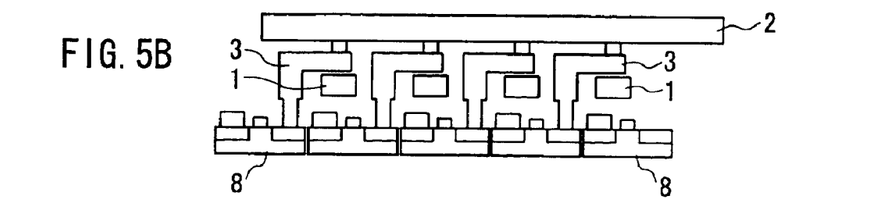

FIGS. 5A and 5B show another example of a memory. This memory includes conductive wires (third conductive wires) 3 in addition to first and second conductive wires 1, 2 that are orthogonal to each other. Magnetoresistive elements 5 are connected to switching elements (MOS transistors) by the third conductive wires 3. In this memory, the first and the second conductive wires 1, 2 are used to apply a magnetic field to each of the magnetoresistive elements 5 for writing information. This information is read as a resistance value of the element using the switching elements 8, the first conductive wires 1, and the third conductive wires 3.

Note that the above embodiments of a magnetoresistive element and a memory are provided only as examples, and that the application of the present invention is not limited to those embodiments.

EXAMPLES

Example 1

The following multilayer film was formed on an Si substrate provided with a thermal oxide film by RF magnetron sputtering and DC sputtering.

Si substrate with a thermal oxide film/Ta (3)/Cu (50)/Ta (3)/IrMn (20)/CoFe (2)/ferromagnetic layer I (6)/AlO (1)/ferromagnetic layer II (6)

The figure in parentheses represents the thickness of each layer in nm (the film thickness is expressed in the same manner in the following).

Both the ferromagnetic layers I, II were made of a metal (alloy) as shown in Tables 1, 2. The ferromagnetic layer I was a pinned layer, and the ferromagnetic layer II was a free layer. By forming films in a magnetic field at room temperature, unidirectional anisotropy was imparted to the antiferromagnetic layer (IrMn). The non-magnetic layer (aluminum oxide: AlOx layer) was prepared by forming an Al film and oxidizing the Al film with the introduction of pure oxygen into a chamber and lamp-heating of the substrate surface (to 200° C.).

Figure 6:
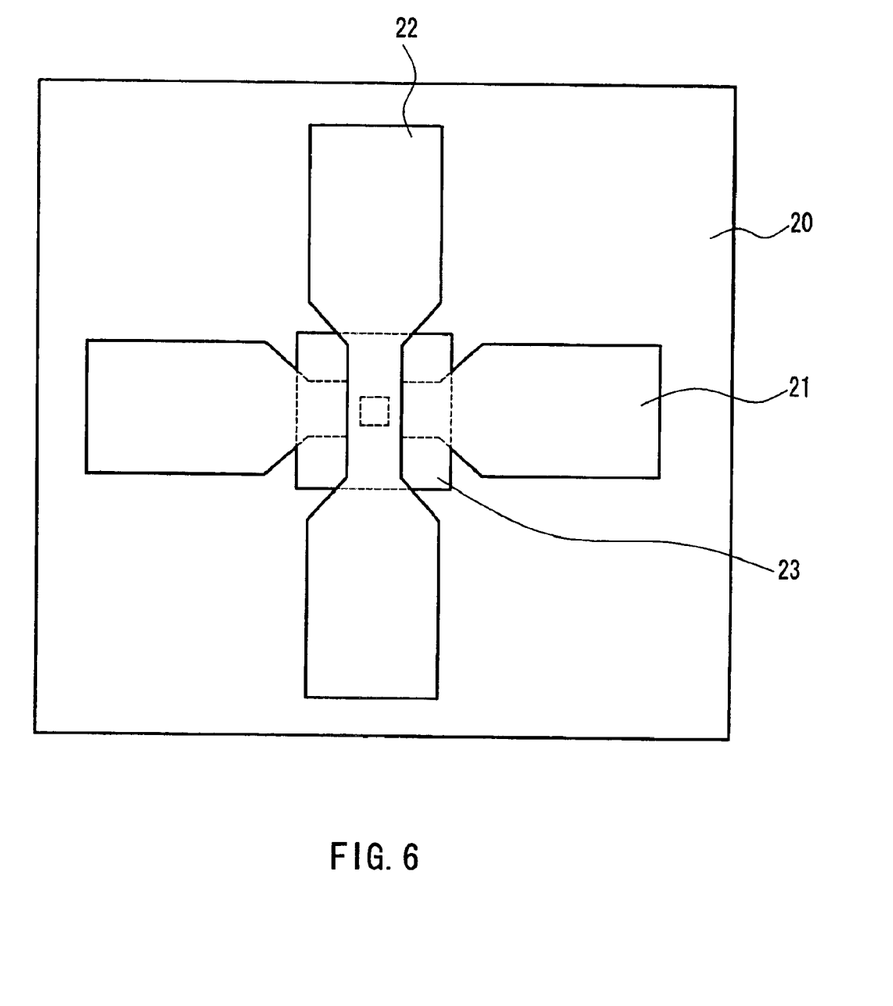
FIG. 6 is a plan view showing a magnetoresistive element for evaluation that was produced in the Examples.

Subsequently, patterning by general photolithography and ion milling etching are performed to produce magnetoresistive elements having a cross-sectional view in FIG. 1 and a plan view in FIG. 6 for evaluation purposes. Cu was used for the upper electrode and $SiO_2$ was used for the interlayer insulating film of the evaluation magnetoresistive elements. A rate of change in magnetoresistance (MR ratio) for each of the magnetoresistive elements thus produced was measured by measuring a resistance using a direct-current four-terminal method while applying a magnetic field. The film composition was analyzed by ion milling, XPS-AES, and SIMS.

Tables 3, 4 show the measurements of MR ratio. The MR ratio is represented by a ratio to the value of the corresponding M.

For D, G, K, and O, the MR ratio was not increased, or rather reduced due to the addition of Pt and Mn. Fe included in the element M of these samples was less than 30 at %. The effect of adding Pt and Mn was significant particularly for E, H, I, L, M, and N. When Fe included in a FeCo alloy or FeCoNi alloy was not less than 40 at %, and Fe included in an FeNi alloy was not less than 30 at %, a sufficient effect was obtained.

TABLE 1

| No. | M |
|---|---|
| A | Fe |
| B | $Fe_{35}Co_{50}Ni_{15}$ |
| C | $Fe_{30}Co_{50}Ni_{20}$ |
| D | $Fe_{25}Co_{50}Ni_{25}$ |
| E | $Fe_{40}Co_{10}Ni_{50}$ |
| F | $Fe_{30}Co_{20}Ni_{50}$ |
| G | $Fe_{20}Co_{30}Ni_{50}$ |
| H | $Fe_{70}Co_{30}$ |
| I | $Fe_{40}Co_{60}$ |
| J | $Fe_{30}Co_{70}$ |
| K | $Fe_{25}Co_{75}$ |
| L | $Fe_{80}Ni_{20}$ |
| M | $Fe_{40}Ni_{60}$ |
| N | $Fe_{30}Ni_{70}$ |
| O | $Fe_{20}Ni_{80}$ |

TABLE 2

| No. | Layer I, Layer II |
|---|---|
| 1 | M |
| 2 | $M_{99.9}Mn_{0.1}$ |
| 3 | $M_{99}Mn_1$ |
| 4 | $M_{80}Mn_{20}$ |
| 5 | $M_{75}Mn_{25}$ |
| 6 | $M_{95}Pt_5$ |
| 7 | $[M_{95}Pt_5]_{99.9}Mn_{0.1}$ |
| 8 | $[M_{95}Pt_5]_{99}Mn_1$ |
| 9 | $[M_{95}Pt_5]_{80}Mn_{20}$ |
| 10 | $[M_{95}Pt_5]_{75}Mn_{25}$ |
| 11 | $M_{90}Pt_{10}$ |
| 12 | $[M_{90}Pt_{10}]_{99.9}Mn_{0.1}$ |
| 13 | $[M_{90}Pt_{10}]_{99}Mn_1$ |
| 14 | $[M_{90}Pt_{10}]_{80}Mn_{20}$ |
| 15 | $[M_{90}Pt_{10}]_{75}Mn_{25}$ |
| 16 | $M_{80}Pt_{20}$ |
| 17 | $[M_{80}Pt_{20}]_{99.9}Mn_{0.1}$ |
| 18 | $[M_{80}Pt_{20}]_{99}Mn_1$ |
| 19 | $[M_{80}Pt_{20}]_{80}Mn_{20}$ |
| 20 | $[M_{80}Pt_{20}]_{75}Mn_{25}$ |
| 21 | $M_{65}Pt_{35}$ |
| 22 | $[M_{65}Pt_{35}]_{99.9}Mn_{0.1}$ |
| 23 | $[M_{65}Pt_{35}]_{99}Mn_1$ |
| 24 | $[M_{65}Pt_{35}]_{80}Mn_{20}$ |
| 25 | $[M_{65}Pt_{35}]_{75}Mn_{25}$ |
| 26 | $M_{60}Pt_{40}$ |
| 27 | $[M_{60}Pt_{40}]_{99.9}Mn_{0.1}$ |
| 28 | $[M_{60}Pt_{40}]_{99}Mn_1$ |
| 29 | $[M_{60}Pt_{40}]_{80}Mn_{20}$ |
| 30 | $[M_{60}Pt_{40}]_{75}Mn_{25}$ |

TABLE 3

| No. | A | B | C | D | E | F | G |
|---|---|---|---|---|---|---|---|
| 1 | 1 | 1 | 1 | 1 | 1 | 1 | 1 |
| 2 | 1.05 | 1.03 | 1.02 | 0.98 | 1.15 | 1.01 | 0.99 |
| 3 | 1.31 | 1.23 | 1.27 | 0.97 | 1.38 | 1.23 | 0.96 |
| 4 | 1.12 | 1.09 | 1.01 | 0.81 | 1.19 | 1.05 | 0.82 |
| 5 | 0.95 | 0.96 | 0.87 | 0.76 | 1.00 | 0.91 | 0.77 |
| 6 | 1.12 | 1.14 | 1.04 | 1.00 | 1.29 | 1.14 | 0.99 |
| 7 | 1.33 | 1.3 | 1.22 | 0.99 | 1.51 | 1.35 | 0.98 |
| 8 | 1.56 | 1.47 | 1.47 | 0.99 | 1.75 | 1.47 | 0.97 |
| 9 | 1.28 | 1.32 | 1.27 | 0.89 | 1.42 | 1.27 | 0.90 |
| 10 | 0.99 | 0.99 | 0.91 | 0.79 | 0.99 | 0.95 | 0.78 |
| 11 | 1.15 | 1.14 | 1.10 | 1.00 | 1.33 | 1.10 | 1.00 |
| 12 | 1.37 | 1.33 | 1.35 | 0.99 | 1.48 | 1.41 | 0.99 |
| 13 | 1.60 | 1.60 | 1.45 | 0.98 | 1.73 | 1.54 | 0.99 |
| 14 | 1.31 | 1.26 | 1.20 | 0.87 | 1.39 | 1.33 | 0.86 |
| 15 | 1.02 | 1.02 | 1.01 | 0.76 | 1.03 | 0.97 | 0.78 |
| 16 | 1.22 | 1.24 | 1.19 | 1.01 | 1.38 | 1.14 | 1.00 |
| 17 | 1.49 | 1.39 | 1.35 | 1.00 | 1.61 | 1.49 | 1.00 |
| 18 | 1.74 | 1.62 | 1.61 | 0.99 | 1.98 | 1.79 | 0.99 |
| 19 | 1.43 | 1.40 | 1.42 | 0.90 | 1.55 | 1.44 | 0.91 |
| 20 | 0.99 | 0.93 | 0.94 | 0.81 | 0.96 | 0.94 | 0.80 |
| 21 | 1.17 | 1.19 | 1.15 | 0.98 | 1.25 | 1.11 | 0.99 |
| 22 | 1.56 | 1.48 | 1.53 | 0.97 | 1.67 | 1.49 | 0.96 |
| 23 | 1.82 | 1.80 | 1.77 | 0.95 | 1.90 | 1.78 | 0.94 |
| 24 | 1.45 | 1.43 | 1.32 | 0.80 | 1.63 | 1.40 | 0.82 |
| 25 | 1.01 | 1.00 | 0.99 | 0.72 | 0.98 | 0.97 | 0.71 |
| 26 | 0.99 | 0.94 | 0.92 | 0.61 | 0.97 | 0.98 | 0.61 |
| 27 | 0.76 | 0.72 | 0.73 | 0.55 | 0.81 | 0.74 | 0.53 |
| 28 | 0.73 | 0.74 | 0.72 | 0.45 | 0.81 | 0.72 | 0.47 |
| 29 | 0.69 | 0.66 | 0.65 | 0.44 | 0.74 | 0.69 | 0.40 |
| 30 | 0.32 | 0.30 | 0.31 | 0.12 | 0.34 | 0.31 | 0.20 |

TABLE 4

| No. | H | I | J | K | L | M | N | O |
|---|---|---|---|---|---|---|---|---|
| 1 | 1 | 1 | 1 | 1 | 1 | 1 | 1 | 1 |
| 2 | 1.26 | 1.16 | 0.98 | 0.97 | 1.36 | 1.30 | 1.02 | 0.98 |
| 3 | 1.59 | 1.55 | 1.24 | 0.93 | 1.62 | 1.55 | 1.31 | 0.94 |
| 4 | 1.35 | 1.35 | 1.05 | 0.81 | 1.48 | 1.31 | 1.08 | 0.79 |
| 5 | 1.01 | 0.98 | 0.90 | 0.75 | 1.03 | 0.99 | 0.92 | 0.75 |
| 6 | 1.34 | 1.22 | 1.07 | 0.98 | 1.51 | 1.41 | 1.10 | 1.00 |
| 7 | 1.59 | 1.59 | 1.25 | 0.97 | 1.80 | 1.60 | 1.33 | 0.97 |
| 8 | 1.82 | 1.76 | 1.52 | 0.94 | 2.05 | 1.82 | 1.50 | 0.98 |
| 9 | 1.48 | 1.54 | 1.20 | 0.89 | 1.61 | 1.58 | 1.22 | 0.89 |
| 10 | 1.01 | 0.96 | 0.97 | 0.75 | 1.03 | 1.00 | 0.93 | 0.76 |
| 11 | 1.34 | 1.30 | 1.14 | 1.00 | 1.47 | 1.33 | 1.16 | 1.00 |
| 12 | 1.60 | 1.63 | 1.31 | 0.96 | 1.76 | 1.63 | 1.41 | 0.96 |
| 13 | 1.97 | 1.79 | 1.61 | 0.95 | 2.05 | 1.99 | 1.65 | 0.97 |
| 14 | 1.55 | 1.48 | 1.30 | 0.82 | 1.76 | 1.64 | 1.31 | 0.85 |
| 15 | 0.99 | 1.00 | 1.00 | 0.76 | 1.03 | 0.99 | 0.97 | 0.73 |
| 16 | 1.48 | 1.36 | 1.25 | 0.98 | 1.66 | 1.41 | 1.18 | 1.00 |
| 17 | 1.80 | 1.65 | 1.42 | 0.99 | 2.00 | 1.87 | 1.52 | 0.99 |
| 18 | 2.20 | 2.06 | 1.64 | 0.96 | 2.32 | 2.06 | 1.80 | 0.97 |
| 19 | 1.68 | 1.59 | 1.47 | 0.89 | 1.84 | 1.76 | 1.45 | 0.88 |
| 20 | 1.01 | 0.99 | 0.99 | 0.76 | 1.03 | 0.99 | 0.95 | 0.80 |
| 21 | 1.43 | 1.32 | 1.14 | 1.00 | 1.50 | 1.44 | 1.13 | 0.96 |
| 22 | 1.82 | 1.73 | 1.48 | 0.94 | 2.02 | 1.91 | 1.60 | 0.94 |
| 23 | 2.25 | 2.16 | 1.83 | 0.93 | 2.47 | 2.30 | 1.89 | 0.93 |
| 24 | 1.72 | 1.61 | 1.49 | 0.81 | 1.95 | 1.82 | 1.43 | 0.80 |
| 25 | 1.01 | 0.99 | 0.95 | 0.65 | 1.03 | 1.00 | 0.97 | 0.68 |
| 26 | 0.99 | 0.92 | 0.97 | 0.61 | 1.03 | 0.96 | 0.91 | 0.60 |
| 27 | 0.92 | 0.90 | 0.74 | 0.48 | 1.03 | 0.93 | 0.76 | 0.53 |
| 28 | 0.86 | 0.82 | 0.71 | 0.43 | 0.98 | 0.85 | 0.71 | 0.42 |
| 29 | 0.83 | 0.80 | 0.68 | 0.36 | 0.94 | 0.84 | 0.72 | 0.43 |
| 30 | 0.39 | 0.38 | 0.30 | 0.11 | 0.42 | 0.38 | 0.32 | 0.10 |

For the samples 5, 10, 15, 20, and 25 to 30, the MR ratio was hardly increased, or rather reduced. In these samples, Mn was not more than 20 at %, and Pt was not more than 35 at %.

The same tendency in the MR ratio was shown when $Fe_{95}Co_5$, $Fe_{90}Co_{10}$, $Fe_{50}CO_{50}$, $Fe_{60}Ni_{40}$, $Fe_{50}Ni_{50}$, $Fe_{50}Co_{25}Ni_{25}$, or the like was used as M of the ferromagnetic layer. When the ferromagnetic layer was a multilayer film, the composition of a portion in contact with the non-magnetic layer affected the MR ratio.

The same tendency in the MR ratio was shown when a PtPd alloy, Pd, Ir, Rh, a PtIr alloy, or the like was used as the noble metal element L of the ferromagnetic layer instead of Pt. The same tendency in the MR ratio was shown when Cr, V, Ti, Zr, Nb, Mo, Hf, Ta, or W was used as the element R instead of Mn. However, Mn provided particularly favorable results.

For the magnetoresistive elements with different structures shown in FIGS. 3A to 3H, the same result also was obtained basically by controlling the interface of any of the non-magnetic layers to have a similar composition. In this case, CrMnPt (20 to 30 nm), $Tb_{25}Co_{75}$ (10 to 20 nm), PtMn (20 to 30 nm), IrMn (10 to 30 nm), PdPtMn (15 to 30 nm), or the like was used as the antiferromagnetic layer. When the pinned layers were stacked via a non-magnetic film to form a so-called synthetic antiferromagnetic material, Ru (0.7 to 0.9 nm), Ir (0.3 to 0.5 nm), Rh (0.4 to 0.9 nm), or the like was used as the non-magnetic film. The figure in parentheses represents the film thickness.

Basically the same tendency in the MR ratio was shown when a $Al_2O_3$ film formed by reactive evaporation, a AlN film formed by plasma reaction, a TaO, TaN or AlN film formed by natural oxidation or nitridation, or a film of DLC, InP, AlON, BN, etc. was used as the non-magnetic layer (barrier).

Table 5 shows a difference in MR ratio with respect to materials for the non-magnetic layer in the samples E6 to E10, H11 to H15, and I16 to I20 of Example 1. The average ratios of the MR ratio for each barrier type to the MR ratio of the natural oxidation alumina (Example 1) were determined and compared. The comparison indicates that the natural oxidation alumina provided the highest MR ratio. A higher MR ratio was achieved for an oxide than for a nitride, DLC (diamond-like carbon), etc.

TABLE 5

|  | Natural oxidation AlO | Plasma oxidation AlO | Natural oxidation TaO | Reactive sputtering AlN | CVD DLC | Reactive ion beam sputtering BN |
|---|---|---|---|---|---|---|
| E6–E10 | 100 | 95 | 96 | 90 | 85 | 92 |
| H11–H15 | 100 | 97 | 97 | 88 | 82 | 86 |
| I16–I20 | 100 | 97 | 95 | 85 | 79 | 81 |

Example 2

Elements having the following configuration were produced in the same manner as Example 1 to evaluate the characteristics after heat treatment.

Si substrate with a thermal oxide film/Ta (3)/Cu (50)/Ta (3)/$Cu_{50}Pt_{50}$ (50)/CoFe (4)/ferromagnetic layer I (2)/AlO (1)/ferromagnetic layer II (6)/Ta (3)

In this example, the elements used a CoPt film (hard magnetic film) instead of an antiferromagnetic layer to eliminate the influence of Mn diffusion. The ferromagnetic layers I, II had a composition expressed by $[M_xPt_y]_{100-z}Mn_z$. The sample A, H or L in Table 1 was used as M. Each of the elements was kept in a magnetic field of 5 kOe at 400° C. for an hour. Table 6 shows the MR ratio for each of the elements.

The MR ratio was increased significantly in the presence of both Mn and Pt.

TABLE 6

| No. | y | z | M A | H | L |
|---|---|---|---|---|---|
| 31 | 0 | 0 | 1.00 | 1.00 | 1.00 |
| 32 | 0.1 | 0 | 1.02 | 1.11 | 1.13 |
| 33 | 5 | 0 | 1.08 | 1.13 | 1.17 |
| 34 | 10 | 0 | 1.06 | 1.13 | 1.15 |
| 35 | 35 | 0 | 0.99 | 1.15 | 1.13 |
| 36 | 40 | 0 | 0.89 | 0.94 | 0.92 |
| 37 | 0 | 0.1 | 1.01 | 1.08 | 1.11 |
| 38 | 0.1 | 0.1 | 1.38 | 1.79 | 1.81 |
| 39 | 5 | 0.1 | 1.47 | 1.81 | 1.98 |
| 40 | 10 | 0.1 | 1.51 | 1.93 | 1.88 |
| 41 | 35 | 0.1 | 1.52 | 2.07 | 2.06 |
| 42 | 40 | 0.1 | 0.86 | 0.98 | 1.03 |
| 43 | 0 | 5 | 0.99 | 1.04 | 1.10 |
| 44 | 0.1 | 5 | 1.49 | 1.95 | 1.98 |
| 45 | 5 | 5 | 1.78 | 2.18 | 2.18 |
| 46 | 10 | 5 | 1.82 | 2.29 | 2.18 |
| 47 | 35 | 5 | 1.89 | 2.18 | 2.42 |
| 48 | 40 | 5 | 0.83 | 0.94 | 1.02 |
| 49 | 0 | 20 | 0.89 | 0.98 | 1.03 |
| 50 | 0.1 | 20 | 1.39 | 1.65 | 1.70 |
| 51 | 5 | 20 | 1.45 | 1.79 | 1.79 |
| 52 | 10 | 20 | 1.49 | 1.82 | 1.90 |
| 53 | 35 | 20 | 1.61 | 1.93 | 2.01 |
| 54 | 40 | 20 | 0.76 | 0.89 | 0.99 |
| 55 | 0 | 30 | 0.72 | 0.81 | 0.85 |
| 56 | 0.1 | 30 | 0.78 | 0.85 | 0.87 |
| 57 | 5 | 30 | 0.82 | 0.86 | 0.91 |
| 58 | 10 | 30 | 0.81 | 0.86 | 0.91 |
| 59 | 35 | 30 | 0.77 | 0.81 | 0.83 |
| 60 | 40 | 30 | 0.24 | 0.25 | 0.32 |

Example 3

The samples A6, H6, and L6 in Example 1 were used so that the thickness of the pinned layer (the ferromagnetic layer I) was changed from 6 nm to 2 nm, and the CoFe layer between the IrMn layer and the pinned layer had a thickness of 0, 2, 10, or 30 nm. These samples were heat-treated in the absence of a magnetic field at different temperatures of 350° C., 400° C., and 450° C. for 30 minutes, followed by the measurement of MR ratio and interfacial composition.

In each of the samples A6, H6, and L6, the composition of Mn at the interface was not more than a detection limit immediately after the film formation. However, when a distance between the interface of the non-magnetic layer and the antiferromagnetic layer (IrMn; the atomic ratio of Ir to Mn is 1:1) was 3 nm to 30 nm, Mn diffused to the interface in an amount of not more than 1% by the heat treatment at 350° C., not more than 8% by the heat treatment at 400° C., and not more than 25% by the heat treatment at 450° C. As a result of this diffusion, the MR ratio after the heat treatment at 350° C. and 400° C. was two to three times larger than that immediately after the film formation. For the sample having a distance of not less than 20 nm, the Mn composition at the interface was not more than 20%, and the MR ratio was the same or approximately increased up to a maximum of two times even after the heat treatment at 450° C.

When the sample was heat-treated in a magnetic field of 5 kOe at 300° C. for 30 minutes to 5 hours before performing the heat treatment at not less than 350° C., the Mn composition at the interface was not changed by the heat treatment for not less than one hour, while the MR ratio was increased by 10% to 50% compared with the element that was not subjected to this heat treatment. As shown in FIGS. 2A to 2C, Mn diffused after alumina and an interfacial impurity layer were separated by the initial heat treatment. Therefore, the tunnel conductive path might include a high proportion of paths through alumina with fewer defects and impurities.

Example 4

A memory schematically shown in FIGS. 4A and 4B was produced by using the sample 17A. This memory was sintered in hydrogen at 400° C., and then the characteristics were measured. The measurement shows that each of the wiring resistance variation, the MR ratio variation, and the MR element yields was improved by 50% or more compared with a memory including the sample 1A.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A magnetoresistive element comprising:

a first ferromagnetic layer;

a second ferromagnetic layer; and a non-magnetic layer arranged between the first ferromagnetic layer and the second ferromagnetic layer, wherein a resistance value changes with a change in relative angle formed by magnetization directions of the first ferromagnetic layer and the second ferromagnetic layer, wherein at least one of the first ferromagnetic layer and the second ferromagnetic layer has a composition expressed by $(M_xL_y)_{100-z}R_z$ at an interface with the non-magnetic layer, where M is $Fe_aCo_bNi_c$, L is at least one element selected from the group consisting of Pt, Pd, Ir, and Rh, R is at least one element selected from the group consisting of Mn, Cr, V, Ti, Zr, Nb, Mo, Hf, Ta, and W, and a, b, c, x, y, and z satisfy a+b+c=100, $a \geq 30$, $b \geq 0$, $c \geq 0$, x+y=100, $0 < y \leq 35$, and $0.1 \leq z \leq 20$, with only one of b and c being capable of being equal to 0, and wherein the non-magnetic layer includes at least one element selected from the group consisting of B, C, N, O, and P.

2. The magnetoresistive element according to claim 1, wherein c=0 and $a \geq 40$.

3. The magnetoresistive element according to claim 1, wherein b=0.

4. The magnetoresistive element according to claim 1, wherein R includes Mn.

5. The magnetoresistive element according to claim 1, further comprising a layer that includes R in an amount of not less than 1.5 z at %, wherein the layer is located 3 nm to 30 nm away from the interface between the ferromagnetic layer and the non-magnetic layer in a direction of the ferromagnetic layer having the composition at said interface.

6. The magnetoresistive element according to claim 1, wherein the non-magnetic layer includes an oxide as the main component.

7. The magnetoresistive element according to claim 6, wherein the oxide is an Al oxide.

8. A nonvolatile memory comprising the magnetoresistive element according to claim 1.

9. A method for manufacturing a magnetoresistive element, the magnetoresistive element comprising:

a first ferromagnetic layer;

a second ferromagnetic layer; and a non-magnetic layer arranged between the first ferromagnetic layer and the second ferromagnetic layer, wherein a resistance value changes with a change in relative angle formed by magnetization directions of the first ferromagnetic layer and the second ferromagnetic layer, the method comprising:

a film formation process for forming the non-magnetic layer and at least one of the first ferromagnetic layer and the second ferromagnetic layer; and at least two heat treatment processes performed after the film formation process, wherein the at least two heat treatment processes comprise a first heat treatment process at 200° C. to 330° C. for not less than one hour and a second heat treatment process at not less than 340° C., and the first heat treatment process is performed before the second heat treatment process.

10. The method according to claim 9, wherein at least one of the first ferromagnetic layer and the second ferromagnetic layer has a composition expressed by $(M_xL_y)_{100-z}R_z$ at an interface with the non-magnetic layer after the at least two heat treatment processes, where M is $Fe_aCo_bNi_c$, L is at least one element selected from the group consisting of Pt, Pd, Ir, and Rh, R is at least one element selected from the group consisting of Mn, Cr, V, Ti, Zr, Nb, Mo, Hf, Ta, and W, and a, b, c, x, y, and z satisfy a+b+c=100, a≧30, b≧0, c≧0, x+y=100, 0<y≦35, and 0.1≦z≦20, with only one of b and c being capable of being equal to 0, and wherein the non-magnetic layer includes at least one element selected from the group consisting of B, C, N, O, and P.

* * * * *

UNITED STATES PATENT AND TRADEMARK OFFICE
CERTIFICATE OF CORRECTION

PATENT NO. : 6,917,492 B2
DATED : July 12, 2005
INVENTOR(S) : Matsukawa et al.

It is certified that error appears in the above-identified patent and that said Letters Patent is hereby corrected as shown below:

Column 12,
Line 54, "1.5 z at %" should read -- 1.5z at % --.

Signed and Sealed this

Eleventh Day of April, 2006

JON W. DUDAS
*Director of the United States Patent and Trademark Office*